United States Patent [19]

Chang et al.

[11] Patent Number: 5,416,337
[45] Date of Patent: May 16, 1995

[54] HETERO-SUPERLATTICE PN JUNCTIONS

[75] Inventors: Leroy L. Chang, Goldens Bridge; Supratik Guha, Mohegan Lake; Hiroo Munekata, Mahopac, all of N.Y.

[73] Assignee: International Business Machines Corporation, Armonk, N.Y.

[21] Appl. No.: 126,686

[22] Filed: Sep. 24, 1993

Related U.S. Application Data

[63] Continuation of Ser. No. 835,655, Feb. 13, 1992, abandoned.

[51] Int. Cl.$^6$ ............... H01L 29/225; H01L 33/00; H01S 3/19
[52] U.S. Cl. .................... 257/13; 257/18; 257/22; 257/103; 257/201; 257/94; 372/45
[58] Field of Search ............ 257/18, 94, 22, 103, 257/201, 13; 372/43, 44, 45

[56] References Cited

U.S. PATENT DOCUMENTS

| | | |
|---|---|---|
| 3,721,583 | 3/1973 | Blakeslee . |
| 4,616,241 | 10/1986 | Biefeld et al. ............... 372/45 |
| 4,688,068 | 8/1987 | Chaffin et al. ............... 357/30 |
| 4,792,832 | 12/1988 | Baba et al. . |
| 4,821,082 | 4/1989 | Frank et al. . |
| 4,866,489 | 9/1989 | Yokogawa et al. . |
| 4,974,044 | 11/1990 | Cunningham et al. . |
| 5,005,057 | 4/1991 | Izumiya et al. ............... 357/17 |
| 5,012,302 | 4/1991 | Goronkin . |
| 5,045,894 | 9/1991 | Migita et al. ............... 257/18 |
| 5,045,897 | 9/1991 | Ahlgren ............... 372/43 |
| 5,136,345 | 8/1992 | Kasahara ............... 372/45 |

FOREIGN PATENT DOCUMENTS

| | | | |
|---|---|---|---|
| 61-26271 | 2/1986 | Japan | H01L 33/00 |
| 0144078 | 7/1986 | Japan . | |
| 63-093189 | 4/1988 | Japan | H01S 3/18 |
| 63-095692 | 4/1988 | Japan | H01S 3/18 |

OTHER PUBLICATIONS

Kolodziejski et al., "Wide-gap II-VI superlattices", IEEE Journal of Quantum Electronics, vol. OE-22, No. 9, Sep. 1986, pp. 1666-1676.
Miller et al., "Novel Hybrid Optically Bistable Switch", Jul. 1, 1984, Appl. Phy. Lett 45(1), pp. 13-15.
Kobayashi, "Realization of Both p-and N-type Conduction for ZnSe-ZnTe Strained-Layer Superlattices", Nov. 16, 1987, Appl. Phy. Lett 51(20), pp. 1602-1604.

*Primary Examiner*—Jerome Jackson
*Attorney, Agent, or Firm*—Blaney Harper; Robert M. Trepp

[57] ABSTRACT

The present invention is a hetero superlattice pn junction. In particular, the invention combines n and p type superlattices into a single pn junction having a bandgap sufficient to create high frequency (i.e. blue or higher) light emission. Individual superlattices are formed using a molecular beam epitaxy process. This process creates thin layers of well material separated by thin layers of barrier material. The well material is doped to create carrier concentrations and the barrier materials are chosen in combination with the thickness of the well materials to adjust the effective bandgap of the superlattice in order to create an effective wide bandgap material. The barrier material for the n and p type superlattices is different from the material used to form either of the two types of well layers. A particular embodiment of the present invention forms a first superlattice from n type doped ZnSe well layers and undoped ZnMnSe barrier layers and forms a second superlattice from p type doped ZnTe well layers and undoped ZnMnSe barrier layers. The first and second superlattices are merged into a hetero superlattice pn junction. The thickness and composition of the individual well and barrier layers can be modified to adjust the effective bandgap of the pn junction. Therefore, a wide bandgap diode is formed from previously incompatible materials.

28 Claims, 3 Drawing Sheets

HETERO-SUPERLATTICE PN JUNCTIONS

GOVERNMENT CONTRACT

This invention was made with Government support under DAAL03-90-C-0008 awarded by Department of the Army. The Government has certain rights in this invention.

This application is a continuation of application Ser. No. 07/835,655, filed Feb. 13, 1992, now abandoned.

FIELD OF THE INVENTION

This invention relates generally to the field of semiconductor devices. In particular, this invention relates to light emitting semiconductor devices (LEDs). More particularly, this invention relates to an LED structure which emits a high frequency light. The frequency of emitted light is related to the effective bandgap of the semiconductor material which is increased by the structure of the device.

BACKGROUND OF THE INVENTION

Semiconductor materials are useful for making a wide variety of electrical and electro-optic devices. This is because of the band structure of the semiconductor material which makes up the device. Semiconductor materials have a conduction band and a valence band which make up the band structure of the material. The conduction band is a range of energy states for charge carriers (electrons) wherein a charge carrier existing in an energy state above a minimum value has the ability to quickly move around the material and conduct current. The valence band is a range of energy states for charge carriers (holes) wherein a carrier existing in an energy state below a maximum value has the ability to quickly move around the material and conduct charge. The minimum and maximum values are called the conduction band edge and the valence band edge respectively. The minimum conduction band edge is always greater than the maximum valence band edge in a semiconductor. The difference in energy between the conduction band edge and the valence band edge is called the bandgap. When carriers which have enough energy to be in the conduction band lose energy and make transitions between the conduction and the valence bands, the carriers give off light. The frequency of light emitted from the semiconductor device is proportional to the size of the bandgap. Therefore, the lost energy of the carriers can be converted into light having a specific frequency by tailoring the bandgap of the semiconductor material.

In order to have carriers lose energy and make a transition from a conduction band to a valence band, carriers must first exist in the conduction band. One way in which semiconductor devices act as a switch in conducting current is to inject carriers from the conduction and valence bands of one type of semiconductor material into the conduction and valence bands of a second type of semiconductor material. That is, electrons are injected from the conduction band of a n-type material to the conduction band of a p-type material by applying a positive voltage to the p-type material with respect to the n-type material across the junction of the two types of material. Similarly, holes are injected from the valence band of the p-type material to the valence band of the n-type material by applying a positive voltage to the p-type material with respect to the n-type material across the junction of the two types of material. As a result, forward biasing a pn junction semiconductor device places electrons in the conduction band of the p-type material and holes in the valence band of the n-type material. These carriers are available to make the bandgap transition and emit light having a frequency proportional to the bandgap energy.

The light emitting pn junction is useful because light is only emitted when the pn junction is forward biased, and therefore, an electrical signal in the form of a high or low voltage can be easily converted into an optical signal in the form of light or no light. An optical signal is useful because many materials have a distinct reaction to light and make optical storage devices which have a higher storage density than electrical storage devices. Further, optical communication is highly desirable because much more data can be transmitted over a single optical fiber than over an electrical connection. In either optical storage or optical communication, a means such as an LED for converting electrical signals to optical signals is a requirement for taking advantage of different optical devices. Prior art LEDs are made of a Group III–V compound such as $GaAs_{1-x}Al_x$ wherein x is a mole fraction of aluminum and typically ranges between 0 and 0.5. LEDs are made of this compound because the $GaAs_{1-x}Al_x$ system is relatively easy to dope and because the bandgap can be tailored to some degree. The $GaAs_{1-x}Al_x$ semiconductor material is easy to dope because it is relatively free of defects which trap the carriers and make the carriers from the dopant immobile. The bandgap can be tailored to some degree by increasing the amount of aluminum added to the III–V compound. As x is increased the bandgap increases to a maximum of approximately 2.2 eV.

It is important to tailor the bandgap of the semiconductor material because as the bandgap gets greater, the energy of the light emitted gets greater and the wavelength of the light gets shorter. The shorter the wavelength, the more signals which can be transmitted and the more data which can be stored in an optical storage media. The problem with the $GaAs_{1-x}Al_x$ semiconductor compound is that the maximum bandgap which can be developed in the material is approximately 2.2 eV (at room temperature). This bandgap corresponds to a yellow emitted light. It would be desirable to have a semiconductor material with a higher bandgap capable of emitting shorter wavelength light. The prior art has recognized this and attempted to use different compound materials which can be both appropriately doped and give the proper bandgap. One such attempt is to use group II–VI compounds for the wide bandgap. These compounds such as ZnSe have bandgaps of approximately 2.7 eV.

The problem with such compounds is that they are not readily made into pn junctions. For example, ZnSe can be easily doped n-type but not p-type, and ZnTe can be easily doped p-type but not n-type. The problem is thought to be due to a self-compensation effect in which acceptor (donor) impurities are electrically compensated for by the creation of oppositely charged point defects. This results in the effective cancellation of the acceptor (donor) dopant. This effect is material dependent and especially pronounced in wide bandgap semiconductors. As a result, doping typically only works for one type of electrical conduction (i.e. p type doping for ZnTe or n type for ZnSe) even though some p type ZnSe devices have been demonstrated. Therefore, pn junctions in any one type of wide bandgap material are difficult to make.

One way in which to avoid the self-compensation effect is to form a pn hetero-junction. In such a structure, the choice of n and p type materials is based on the ease of doping the materials and the compatibility of different lattice constants, among other considerations. The region where radiative recombination takes place is determined by the relative amount of injected carriers from one side to the other (i.e. electrons from the n to p side or holes from the p to n side). The relative injection of carriers is controlled by the size of the band offset and the carrier concentration in each side of the pn junction. It is also important to have close lattice constants between the two materials so that dislocations and defects in the lattice will not prevent proper injection of carriers across the pn junction. Hetrojunctions made of p-type ZnTe and n-type ZnSe satisfy the doping consideration. However, these materials have approximately a 7% lattice mismatch when combined in a pn junction. This large mismatch generates defects in the pn junction and reduces the carrier injection across the pn junction. Another problem with this structure is the band offset. The conduction band offset is smaller than the valence band offset. This allows substantially more electrons to be injected into the p-type material than holes injected into the n-type material. As a result, more electron recombination in the p-type region will be generated than hole recombination in the n-type region. This will produce a lower energy and longer wavelength emission because the p-type ZnTe has a lower bandgap than n-type ZnSe.

Another prior art attempt to create a wide bandgap material employed a modulation doping technique to a short period, strained superlattice structure (SLS) in the ZnTe/ZnSe system. The technique demonstrated that p type conduction could be attained by doping the ZnTe layers p type with antimony (Sb) and interleaving the ZnTe layers with ZnSe layers. One period of the p type material has a 1 nm ZnTe layer and a 1 nm ZnSe layer and the p type layer has 300 such periods. The problem with this structure is that the hole concentrations is not high. Particularly, it is only approximately $10^{-3}/cm^3$, whereas practical device applications require hole concentrations of approximately $10^{17}/cm^3$. The low hole concentration means that the dominant radiative recombination will be electrons recombining in the lower bandgap p-type material. Moreover, band to band emission was not the dominant radiative recombination process because the intensity of photoluminescence peaked at approximately 2.006 eV which is much lower than normal band to band recombination.

OBJECTS OF THE INVENTION

It is an object of the present invention to manufacture light emitting semiconductor devices.

It is another object of the present invention to manufacture semiconductor laser devices.

It is a further object of the present invention to manufacture light emitting semiconductor devices which emit a high frequency light.

It is still another object of the present invention to manufacture high frequency light emitting devices which efficiently generate light.

It is still a further object of the present invention to manufacture high frequency light emitting devices which generate coherent light.

It is still another object of the present invention to manufacture high frequency light emitting devices having improved manufacturability.

SUMMARY OF THE INVENTION

The present invention is a hetero superlattice pn junction. In particular, the invention combines n and p type superlattices into a single pn junction having a bandgap sufficient to create high frequency (i.e. blue or higher) light emission. Individual superlattices are formed using a molecular beam epitaxy process. This process creates thin layers of well material separated by thin layers of barrier material. The well material is doped to create carrier concentrations and the barrier materials are chosen in combination with the thickness of the well materials to adjust the effective bandgap of the superlattice in order to create an effective wide bandgap material. The barrier material for the n and p type superlattices is different from the material used to form either of the two types of well layers. A particular embodiment of the present invention forms a first superlattice from n type doped ZnSe well layers and undoped ZnMnSe barrier layers and forms a second superlattice from p type doped ZnTe well layers and undoped ZnMnSe barrier layers. The first and second superlattices are merged into a hetero superlattice pn junction. The thickness and composition of the individual well and barrier layers can be modified to adjust the effective bandgap of the pn junction. Therefore, a wide bandgap diode is formed from previously incompatible materials.

DESCRIPTION OF THE PREFERRED EMBODIMENT

Figure 1:
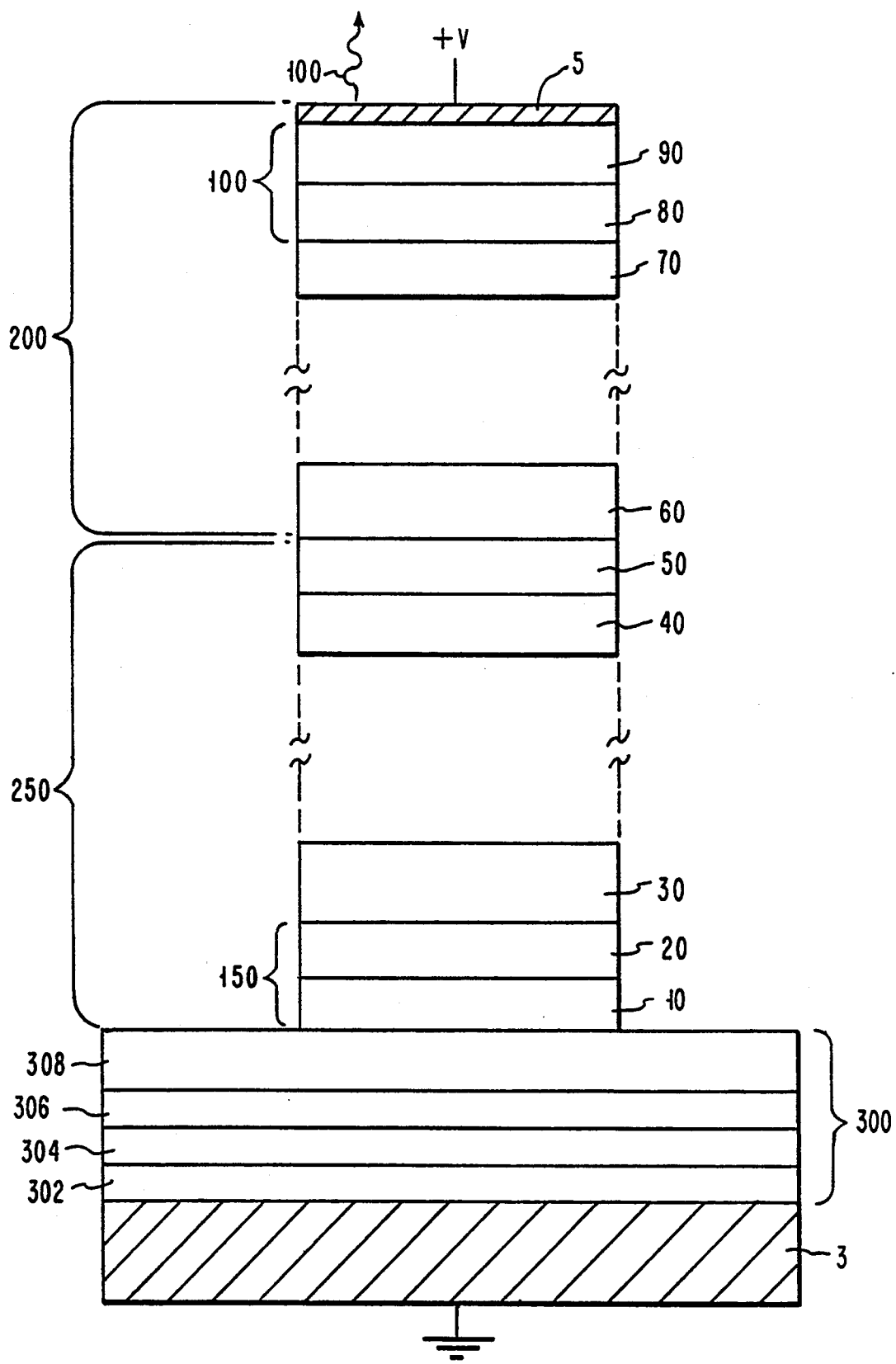
FIG. 1 illustrates a physical embodiment the present invention.

FIG. 1 illustrates the pn junction structure of a preferred embodiment of the present invention. FIG. 1 illustrates a multilayer structure in which layers 10, 30, and 40 are formed of a first semiconductor compound, layers 60, 70, and 90 are formed of a second semiconductor compound, layer 80 is formed of a third semiconductor compound, and layer 20 is formed of a fourth semiconductor compound. Layer 50 may be formed of either the third or fourth type of semiconductor compound or it may be formed of a combination of the third and fourth types of semiconductor compounds. The first semiconductor compound is capable of being doped n-type and the second type of semiconductor compound is capable of being doped p-type. The third semiconductor layer is a barrier layer which is interposed between two p type layers. The p type layer 90 and the barrier layer 80 form a first period 100 of the pn junction. The first period of the pn junction is replicated at least once and typically approximately 100 times to form the p type superlattice 200. The fourth type of semiconductor compound is a barrier layer which is interposed between two n type layers. The n type layer 10 and the barrier layer 20 form a second period 150 of the pn junction. The second period is replicated at least once and typically approximately 100 times to form an n type superlattice 250. Layer 50 separates the n type superlattice 250 from the p type superlattice 200. The n type superlattice 250 separated by the barrier layer 50 from the p type superlattice 200 forms the hetero superlattice pn junction of the present invention. In this particular embodiment, the barrier layers are intrinsic and not doped. The contacts 3 and 5 are formed on the n and p type superlattices respectively for applying a voltage across the pn junction.

The first and second types of semiconductors are chosen for their ease of being doped either n or p type respectively. In particular, wide bandgap materials such as II-VI compounds, I-III-VI chalcopyrites, and II-III-VI chalcopyrites, are chosen for the characteristic of being capable of controlled doping of either n or p type. The third and fourth types of materials are chosen for their epitaxial compatibility, distribution of band discontinuities, lattice matching, and common element sharing with second and first types of semiconductors respectively. The third and fourth semiconductor materials are barrier layers interposed between the second and first semiconductor materials respectively. The barrier materials must have close enough lattice matching to avoid introducing too much strain into the superlattices. An acceptable amount of lattice mismatch is approximately 1-3%. Lattice mismatch above this amount causes unacceptable amount of carrier traps in the pn junction. The barrier layers introduce valence and conduction band discontinuities into the valence and conduction bands of the n and p type well materials of the superlattice. These band discontinuities must be tailored to achieve the required effective bandgap for efficient radiative recombination. For example, when the p-type bandgap is approximately 2.6 eV and electron recombination in the p-type region is the dominant mode of radiative recombination, the barrier layer must have a bandgap of approximately 3.0 eV to create an effective bandgap of approximately 2.8 eV in the p-type material. The selection of a barrier layer material having a bandgap larger than the well material tailors the band edge discontinuities to increase the effective bandgap of the superlattice.

Figure 2:
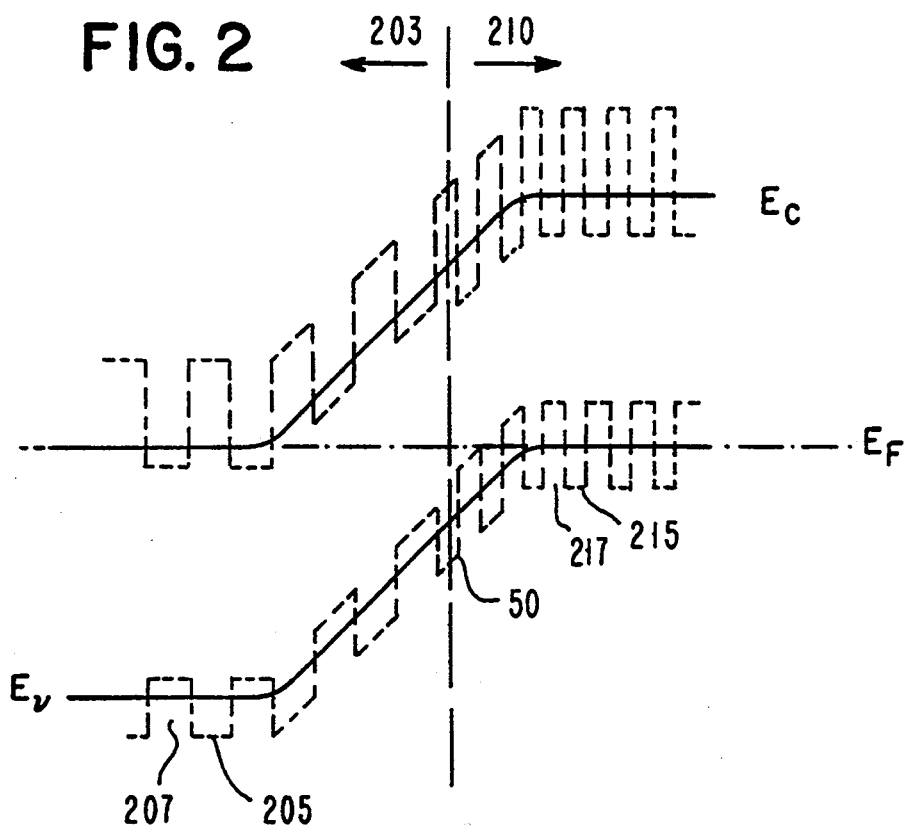
FIG. 2 illustrates the band diagram of the present invention.

FIG. 2 illustrates a band diagram for a hetero-superlattice according to the present invention. A first barrier semiconductor material $A_b$ 205 is interposed between two layers of a first well material $A_w$ 207. The first well material 207 is doped n type and the barrier material is not doped. The conduction band is higher in energy in the barrier material than in the well material and the barrier valence band is lower in energy than the well valance band. The effective conduction band in the first superlattice 203 is higher than the conduction band in the well material but lower than the conduction band in the barrier material. Similarly, the effective valence band in the first superlattice 203 is lower in energy than the well material valence band but higher than the barrier material valance band. Also, a second barrier semiconductor material $B_b$ 215 is interposed between two layers of a second well material $B_w$ 217. The second well material 217 is doped p type and the barrier material is intrinsic. Again, the effective conduction band in the second superlattice 210 is higher than the conduction band in the well material but lower than the conduction band in the barrier material. Further, the effective valence band in the second superlattice is lower than the valence band of the well material but higher than the valence band of the barrier material. The p and n type superlattices are joined into a pn junction hetero superlattice through barrier layer 50. FIG. 2 illustrates the effective energy band diagram at thermal equilibrium and no applied voltage. When a forward voltage is applied to the hetero superlattice, electrons are injected from the n type superlattice into the conduction band of the p type superlattice where they recombine radiatively through a sufficiently large bandgap energy to produce a high (blue or greater) frequency light. Holes are also injected from the p-type material into the valence band of the n-type material and recombine into the conduction band through a sufficiently large bandgap to produce a high (blue or higher) frequency light.

Figure 3:
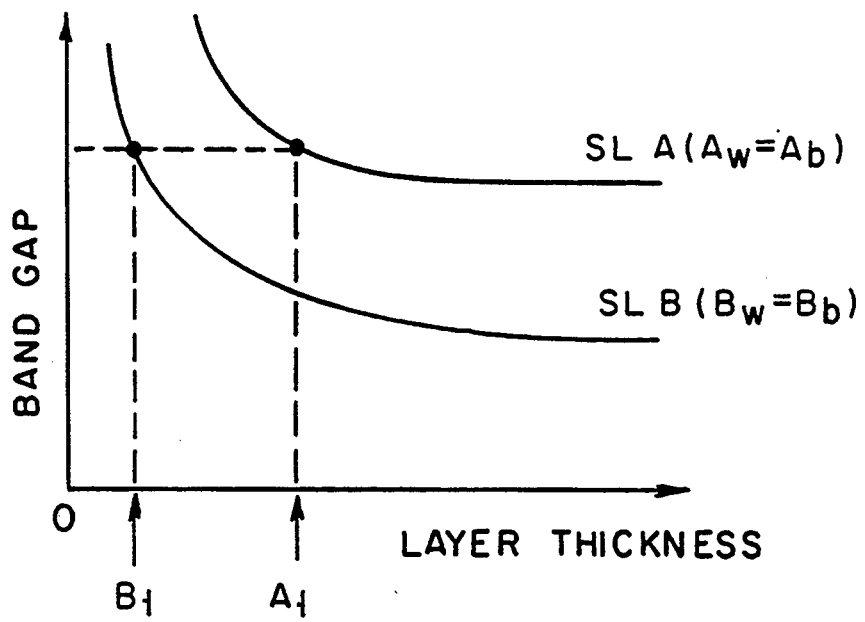
FIG. 3 illustrates a general relationship between the effective bandgap and the superlattice layer thickness of the present invention.

The degree to which the effective conduction or valence band edge is different from the respective band edges in either the well or barrier materials alone, depends on the thicknesses of the well and the barrier materials. FIG. 3 illustrates the general relationship between the effective bandgap (difference between the valence and conduction band edges) for hypothetical superlattices A and B. Superlattice A has a well material having a relatively large bandgap energy and having a thickness equal to the thickness of the barrier layer. Superlattice B has a well material having a relatively small bandgap and having a thickness equal to the thickness of the barrier layer. As the thickness of the well and barrier layers for material A decreases, the effective bandgap rises. Material B has a lower bandgap for thick layers of well and barrier layers but this bandgap can be raised to that of material A when the thickness of material B is reduced a sufficient amount below the thickness of material A. FIG. 3 assumes that the thickness of the well material is the same as the thickness of the barrier material and this simple case is only explanatory. The well material may be thicker than the barrier layer or the barrier layer may be thicker than the well material depending on how the effective bandgap is to be adjusted.

The effect of well and barrier layer thickness on the effective bandgap is important for two reasons. First, the effective bandgap of a superlattice can be adjusted by merely changing the thickness of the superlattice layers. Second, different superlattices can have their bandgaps adjusted by different amounts. This second effect is important because the relative alignment of the effective bandgap edges determines not only the wavelength of emitted light but it also determines the relative quantity of light emitted in the particular bandgap region. For example, if hole injection into the n-type material emits a low frequency light compared to electron injection into the p-type material, then the total emitted light from the device has low frequency components. The difference in frequency of emission between the n and p type superlattices can be reduced, as explained above, by making the well and barrier layers of the n-type superlattice thinner than the p-type superlattice. Also, this adjustment lowers the amount of holes injected into the n-type superlattice for a given forward bias which lowers the amount of low frequency components in the emitted light of the structure.

The structure of FIG. 1 is built through the use of conventional epitaxial growth process equipment that has the capability to deposit thin layers of epitaxial material. Process equipment such as a conventional molecular beam epitaxial (MBE) growth system is preferred but other equipment such as a conventional organo-metallic vapor phase epitaxial growth system is sufficient. FIG. 1 illustrates that the pn junction hetero superlattice structure is formed on a four layer N+ buffer/substrate structure 300. The structure of FIG. 1 is built by loading an N+ doped GaAs <100> substrate 302 into a molecular beam epitaxy chamber. The substrate 302 is heated to approximately 600° C. to remove surface oxide from the substrate. The temperature is then reduced to 580° C. and a GaAs buffer layer 304 having approximately 300 nanometer (nm) thickness is grown over the GaAs substrate. Layer 304 is a GaAs layer doped with silicon. The silicon concentration is approximately $2 \times 10^{18}/cm^3$. This is followed by the growth of an N+ $Ga_{1-x}In_xAs$:Si buffer layer 306 at 475° C. The indium composition in this buffer layer has been monotonically increased from X=0 to X=0.23 and the thickness of this layer is approximately 700 nm. Again, the silicon concentration is approximately $2 \times 10^{18}/cm^3$. A third N+ buffer layer 308 is then deposited on the wafer which has a composition of $Ga_{1-x}In_xAs$:Si wherein x is 0.23 and the thickness is 300 nm. The N+ dopant is added to all the buffer layers by opening the silicon effusion cell in the MBE chamber and maintaining the substrate 302 at 1050° C. which yields an electron concentration of $2 \times 10^{18}/cm^3$ in the buffer layer. After buffer layer 308 is grown, the temperature of the substrate 302 is reduced to approximately 300° C. and the surface of the buffer layer 308 is exposed to Zn flux for approximately one minute. The concentration of the Zn flux is approximately $5 \times 10^{14}/cm^2$ but the sticking efficiency of Zn is very poor so little of the Zn remains in the layer 308. This process is performed to chemically modify the surface of the buffer layers to provide a smooth growing surface for the structural layers to follow.

Once the buffer layers have been formed, the n type superlattice 250 can be grown. The superlattice 250 has 100 layers, 50 layers of ZnSe separated by 50 layers of undoped ZnMnSe. The ZnSe layers are approximately 4 nm thick and range between 1 and 10 nm thick. The ZnMnSe layers are 1.5 nm thick and range in thickness from 1 to 5 nm thick. The alternating layers are formed at 300° C. and composition control is maintained by opening and closing the effusion cell shutters of Mn and $ZnCl_2$ while the Zn and Se shutters are kept open. The growth rate of ZnSe is 0.26 nm/sec. and the growth rate of ZnMnSe is 0.35 nm/sec. The composition of the ZnMnSe layer is approximately $Zn_{0.7}Mn_{0.3}Se$. The $ZnCl_2$ cell temperature is set between 100° and 120° C. to give an electron concentration of approximately $1-5 \times 10^{18}/cm^3$ in the superlattice 250 region. The growth of the p type superlattice region 200 is started immediately after the last ZnMnSe layer has been formed. The superlattice 200 is formed of 100 alternating layers of phosphorus doped ZnTe and intrinsic ZnMnSe. Composition control of the superlattice 200 is achieved by opening or closing the effusion cell shutters on the MBE system of Mn, Se, Te, and P while keeping the Zn shutter open. The temperature of the chamber remains at 300° C. The phosphorus doped ZnTe layers are approximately 1 nm thick ranging between 0.5 and 5 nm in thickness. The ZnMnSe layers are also 1 nm thick ranging between 0.5 and 5 nm in thickness. Also the ZnMnSe composition is the same in the superlattice 200 as it is in the superlattice 250. The resulting hole concentration in the superlattice 250 is $1-10 \times 10^{17}/cm^3$.

Once the superlattice 200 is formed over the superlattice 250 and over the buffer structure 300, the planar structure is ready to be formed into diode structures by conventional lithography and cleaving techniques. In particular, mesas are etched into the superlattice layers. The etch removes selective areas of superlattice structures to form a mesa of a pn junction hetero-superlattice structure on top of a buffer/substrate structure 300. Gold is evaporated onto the superlattice structure 200 to make a contact 5 to the p type superlattice 200. The gold electrode is approximately 50 nm thick and semitransparent. The contact 3 to the n type superlattice 250 is made through the buffer/substrate structure 300 by a metallic header. A positive voltage can then be applied to the gold electrode 5 with respect to the metallic header 3. The diode emits a blue light through the semitransparent electrode at room temperature. Spectral analysis measures an emission peak at 480 nm.

Figure 4:
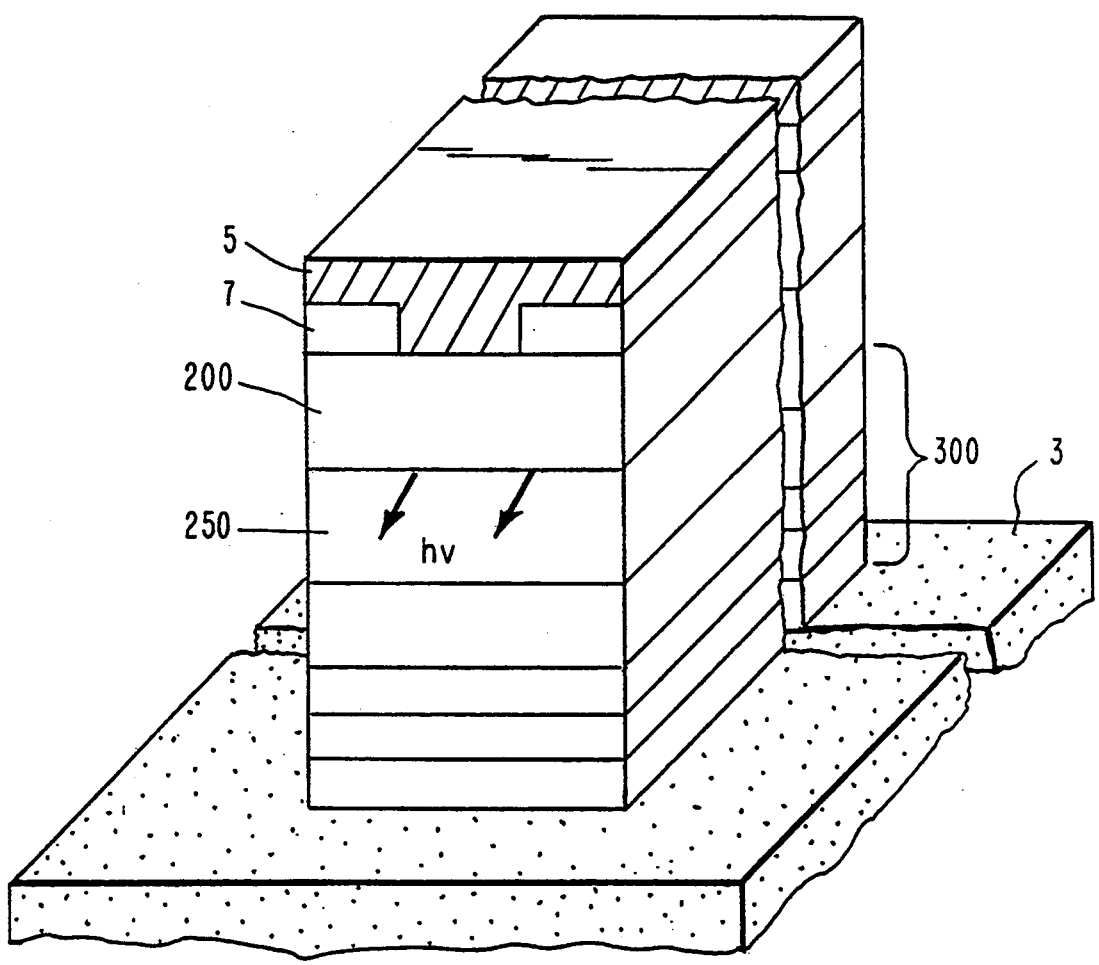
FIG. 4 illustrates an alternate physical embodiment of the present invention.

A second diode structure for the pn junction hetero-superlattice is shown in FIG. 4. In this case a $Si_3N_4$ layer 7 is deposited over the superlattice 200. The layer 7 is then patterned and etched using conventional photolithography techniques. The pattern is an opening in layer 7 which is typically 800 microns long and 20 microns wide (although the width of the opening can vary greatly from several microns to several hundred or more microns). A layer of gold 5 is evaporated onto layer 7 and covering the etched opening. The gold layer is approximately 150 nm thick. The processed GaAs wafer is then cleaved into cavity structures having a length of typically 1.0 millimeter and a width of approximately 0.6 millimeters. These cavity structures are then mounted on a copper heat sink which forms the contact 3 to the N+ type buffer/substrate structure. Again, positive voltage is applied to the gold contact with respect to the N+ contact 3 to forward bias the pn diode. Under forward bias condition with a threshold current density of approximately 625 A/$cm^2$ the line width of the emission spectrum becomes very narrow, and coherent blue light emission occurs from the cleaved sidewalls.

Alternate embodiments of the present invention can be fabricated by forming the first and second superlattice structures with alternative materials. In particular, the superlattice bandgaps are tailored by changing the thickness of the well and barrier layers and by changing the materials from which the well and barrier layers are formed. FIG. 3 illustrated the general relationship between the well and barrier layer thicknesses and the bandgap. This general relationship can be used when selecting from a variety of materials for making the well and barrier layers. A specific example of selecting compatible materials for the well and barrier layers is given below:

A first 0.5 micron buffer layer of n-type $ZnS_{1-x}Se_x$ doped with Cl grown on an N+ Si<100> substrate, wherein X is monotonically graded from 0 to 0.5. A second 1 micron buffer layer of $ZnS_{0.5}Se_{0.5}$ doped with Cl grown on the first buffer layer wherein the electron concentration of these buffer layers is $2 \times 10^{18}/cm^3$. A first superlattice comprised of 30 ZnSe well layers having a thickness of approximately 1.5 nm and 30 barrier layers of ZnS having a thickness of approximately 1.5 nm. The well layers are doped with Cl simultaneously with the growth of the layers. The first superlattice is grown on top of the barrier layers. A second superlattice is grown on top of the first superlattice. Immediately following the formation of the first superlattice which is terminated by an ZnSe well layer, a barrier layer of $ZnS_{0.75}Te_{0.25}$ having a 1 nm thickness starts the formation of the second superlattice. The second superlattice has 30 well layers of $ZnSe_{0.7}Te_{0.3}$ and 30 barrier layers of $ZnS_{0.75}Te_{0.25}$. The p-type well layers are doped with nitrogen or phosphorous to a concentration of approximately $1 \times 10^{17}/cm^3$. The Si wafer then has an approximately 50 nm thick semi-transparent gold layer evaporated on it to form one electrode. The Si wafer is then conventionally etched to form mesa diode structures having approximately a one millimeter diameter. Application of approximately 10 volts of forward bias between the N+ silicon and the gold contact results in emission of light having an emission peak of approximately 420 nm.

Other examples of heterjunction systems are formed by combining n-type well layers in a first superlattice with p-type well layers in a second superlattice wherein each superlattice has compatible barrier layers. Suitable n-type well materials are: ZnSe, ZnS, and CdS (each doped with Al, In, Ga, Cl, Br, I, or F) or their alloys such as Zn(Se,S), (Zn,Cd)S, (Zn,Cd)Se, (Zn,Cd)(Se,S). Suitable p-type layers are ZnTe (doped by As, Sb, P, N, Bi, Cu, Ag, Au, Li, or Na); ZnTe based alloys, such as Zn(SeTe), (Zn,Cd)Te, Zn(Te,S), (Zn,Cd)(Te,S), and (Zn,Cd)(Te,Se); ZnSe (doped with N or Li); and ZnSe based alloys such as (Zn,Cd)Se and Zn(S,Se). Suitable barrier layers are: (Zn,Mn)Se for n or p type well layers in a superlattice; (Zn,Mn)(Se,Te) for p type well layers in a superlattice; (Zn,Mn)(S,Se) for n type well layers in a superlattice; and (Zn,Mn)(S,Te) for p type well layers in a superlattice. Barrier layers which do not contain Mn are Zn(S,Se) for n type well and Zn(S,Te) for p type well layers. In the case of no Mn, the S substitutes for group VI sites instead of Mn substituting for group II sites which boosts the superlattice band gaps of both n and p type materials.

A further embodiment of the present invention uses I–III–VI type Chalcopyrite in combination with a II–VI group compound. Specifically, a p type superlattice has $CuAlS_2$ as a well layer and undoped ZnS as a barrier layer. The n type superlattice has doped ZnSe as a well layer and ZnS as a barrier layer. More particularly, an MBE tool is used to grow an n type $ZnS_{0.5}Se_{0.5}$ as a buffer/substrate layer on an n type silicon substrate. Alternating layers of ZnSe and ZnS are then deposited which form approximately 100 periods of ZnSe/ZnS. The ZnSe layers form the well layers and are doped with Cl to a concentration of approximately $1 \times 10^{19}/cm^3$ and are approximately 1.5 nm thick. The ZnS barrier layers are undoped and are approximately 1.5 nm thick. The n-type superlattice formed by the 100 periods of ZnSe/ZnS is ended by a ZnS barrier layer. A p-type superlattice is then formed over the n-type superlattice. The p-type superlattice has p-type well layers formed of $CuAlS_2$. The well layer has a bandgap of approximately 3.4 eV, is doped p-type by Zn to a concentration of approximately $1 \times 10^{19}/cm^3$, and has a thickness of approximately 1.5 nm. The barrier layer is undoped ZnS and has a thickness of approximately 1.5 nm. The p-type superlattice consists of approximately 100 periods of well and barrier layers. Contacts are formed on the n-type buffer/substrate and p-type superlattice structures in a similar manner as shown in FIG. 1. Application of a forward bias is expected to exhibit radiation in the 3.0 to 3.5 eV energy range.

A further embodiment of the present invention dopes the barrier layers rather than the well layers as illustrated above. In particular, the effective bandgap of a doped material in a superlattice is raised by introducing a larger bandgap barrier layer which is compatible with the well material into the superlattice. Similarly, when the barrier material of a superlattice is doped, an undoped well material having a lower bandgap will decrease the effective bandgap of the superlattice. The well material introduces discontinuities in the wide bandgap structure which lower the effective bandgap of the superlattice. The overall effect of the hetero-superlattice structure remains the same. When the well and barrier layers are compatible in lattice structure (having a lattice mismatch of less than approximately 1–3%), then the source of the carrier concentration may be either from the well or the barrier for n or p type superlattices.

While the invention has been described and illustrated with respect to plural embodiments thereof, it will be understood by those skilled in the art that various changes in the detail may be made therein without departing from the spirit, scope, and teaching of the invention. Therefore, the invention disclosed herein is to be limited only as specified in the following claims.

Having thus described our invention what we claim as new and desire to secure as Letters Patent, is:

1. A semiconductor device, comprising:
    a first superlattice forming a pn junction with a second superlattice, said first superlattice having a plurality of first well layers interposed between a plurality of first barrier layers, said first well layers being of a first conductivity type and comprised of a first II–VI semiconductor compound doped to a concentration of greater than $10^{17}/cm^3$; and
    said second superlattice having a plurality of second well layers interposed between a plurality of second barrier layers, said second well layers being of a second conductivity type and comprised of a second II–VI semiconductor compound doped to a concentration of greater than $10^{17}/cm^3$.

2. A semiconductor device, as in claim 1 wherein:
    said first well layers are doped p-type; and
    said second well layers are doped n-type.

3. A semiconductor device, as in claim 2 wherein:
    said first well layers have a thickness of between approximately 1 and 10 nanometers;
    said second well layers have a thickness of between approximately 1 and 10 nanometers; and
    said first and second barrier layers have a thickness of between approximately 1 and 10 nanometers.

4. A semiconductor device, as in claim 3 wherein:
    said first barrier layers have a bandgap larger than said first well layers; and
    said second barrier layers have a bandgap larger than said second well layers.

5. A semiconductor device, as in claim 1 wherein:
    said first barrier layers are doped p-type; and
    said second barrier layers are doped n-type.

6. A semiconductor device, as in claim 5 wherein:
    said first well layers have a thickness of between approximately 1 and 10 nanometers;
    said second well layers have a thickness of between approximately 1 and 10 nanometers; and
    said first and second barrier layers have a thickness of between approximately 1 and 10 nanometers.

7. A semiconductor device, as in claim 6 wherein:
    said first barrier layers have a bandgap larger than said first well layers; and
    said second barrier layers have a bandgap larger than said second well layers.

8. A semiconductor device, comprising:

a first superlattice forming a pn junction with a second superlattice, said first superlattice having a plurality of first well layers interposed between a plurality of first barrier layers, said first well layers being of a first conductivity type and comprised of a first II-VI semiconductor compound doped to a concentration of greater than $10^{17}/cm^3$;

said second superlattice having a plurality of second well layers interposed between a plurality of second barrier layers, said second well layers being of a second conductivity type and comprised of a second II-VI semiconductor compound doped to a concentration of greater than $10^{17}/cm^3$; and said plurality of first and second barrier layers comprised of a zinc and manganese alloy.

9. A semiconductor device, as in claim 8 wherein:
said first well layers are doped p-type; and
said second well layers are doped n-type.

10. A semiconductor device, as in claim 9 wherein:
said first well layers have a thickness of between approximately 1 and 10 nanometers;
said second well layers have a thickness of between approximately 1 and 10 nanometers; and
said first and second barrier layers have a thickness of between approximately 1 and 10 nanometers.

11. A semiconductor device, as in claim 10 wherein:
said first barrier layers have a bandgap larger than said first well layers; and
said second barrier layers have a bandgap larger than said second well layers.

12. A semiconductor device, as in claim 8 wherein:
said first barrier layers are doped p-type; and
said second barrier layers are doped n-type.

13. A semiconductor device, as in claim 12 wherein:
said first well layers have a thickness of between approximately 1 and 10 nanometers;
said second well layers have a thickness of between approximately 1 and 10 nanometers; and
said first and second barrier layers have a thickness of between approximately 1 and 10 nanometers.

14. A semiconductor device, as in claim 13 wherein:
said first barrier layers have a bandgap larger than said first well layers; and
said second barrier layers have a bandgap larger than said second well layers.

15. A semiconductor device, comprising:
a first superlattice forming a pn junction with a second superlattice, said first superlattice having a plurality of first well layers interposed between a plurality of first barrier layers, said first well layers being of a first conductivity type and comprised of a first II-VI semiconductor compound doped to a concentration of greater than $10^{17}/cm^3$;

said second superlattice having a plurality of second well layers interposed between a plurality of second barrier layers, said second well layers being of a second conductivity type and comprised of a second II-VI semiconductor compound doped to a concentration of greater than $10^{17}/cm^3$; and said plurality of first and second barrier layers comprising $ZnS_xSe_{1-x}$ wherein x has a value of between approximately 0 and 1.

16. A semiconductor device, as in claim 15 wherein:
said first well layers are doped p-type; and
said second well layers are doped n-type.

17. A semiconductor device, as in claim 16 wherein:
said first well layers have a thickness of between approximately 1 and 10 nanometers;
said second well layers have a thickness of between approximately 1 and 10 nanometers; and
said first and second barrier layers have a thickness of between approximately 1 and 10 nanometers.

18. A semiconductor device, as in claim 17 wherein:
said first barrier layers have a bandgap larger than said first well layers; and
said second barrier layers have a bandgap larger than said second well layers.

19. A semiconductor device, as in claim 15 wherein:
said first barrier layers are doped p-type; and
said second barrier layers are doped n-type.

20. A semiconductor device, as in claim 19 wherein:
said first well layers have a thickness of between approximately 1 and 10 nanometers;
said second well layers have a thickness of between approximately 1 and 10 nanometers; and
said first and second barrier layers have a thickness of between approximately 1 and 10 nanometers.

21. A semiconductor device, as in claim 20 wherein:
said first barrier layers have a bandgap larger than said first well layers; and
said second barrier layers have a bandgap larger than said second well layers.

22. A semiconductor device, comprising:
a first superlattice forming a pn junction with a second superlattice, said first superlattice having a plurality of first well layers interposed between a plurality of first barrier layers, said first well layers being of a first conductivity type and comprised of a first II-VI semiconductor compound doped to a concentration of greater than $10^{17}/cm^3$;

said second superlattice having a plurality of second well layers interposed between a plurality of second barrier layers, said second well layers being of a second conductivity type and comprised of a second II-VI semiconductor compound doped to a concentration of greater than $10^{17}/cm^3$; and said plurality of first and second barrier layers comprising $ZnS_xTe_{1-x}$ wherein x has a value of between approximately 0 and 1.

23. A semiconductor device, as in claim 22 wherein:
said first well layers are doped p-type; and
said second well layers are doped n-type.

24. A semiconductor device, as in claim 23 wherein:
said first well layers have a thickness of between approximately 1 and 10 nanometers;
said second well layers have a thickness of between approximately 1 and 10 nanometers; and
said first and second barrier layers have a thickness of between approximately 1 and 10 nanometers.

25. A semiconductor device, as in claim 24 wherein:
said first barrier layers have a bandgap larger than said first well layers; and
said second barrier layers have a bandgap larger than said second well layers.

26. A semiconductor device, as in claim 22 wherein:
said first barrier layers are doped p-type; and
said second barrier layers are doped n-type.

27. A semiconductor device, as in claim 26 wherein:
said first well layers have a thickness of between approximately 1 and 10 nanometers;
said second well layers have a thickness of between approximately 1 and 10 nanometers; and
said first and second barrier layers have a thickness of between approximately 1 and 10 nanometers.

28. A semiconductor device, as in claim 27 wherein:
said first barrier layers have a bandgap larger than said first well layers; and
said second barrier layers have a bandgap larger than said second well layers.

* * * * *